United States Patent
Furukawa et al.

(10) Patent No.: US 7,521,808 B2
(45) Date of Patent: Apr. 21, 2009

(54) WIRING PATERNS FORMED BY SELECTIVE METAL PLATING

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/745,610

(22) Filed: May 8, 2007

(65) Prior Publication Data
US 2007/0207604 A1  Sep. 6, 2007

Related U.S. Application Data

(62) Division of application No. 10/905,590, filed on Jan. 12, 2005, now Pat. No. 7,345,370.

(51) Int. Cl.
    *H01L 28/528* (2006.01)
(52) U.S. Cl. ........................ 257/774; 438/618
(58) Field of Classification Search .......... 257/774, 257/E21.641
    See application file for complete search history.

(56) References Cited

U.S. PATENT DOCUMENTS

| | | |
|---|---|---|
| 4,919,768 A | 4/1990 | Bladon |
| 5,114,834 A | 5/1992 | Nachshon |
| 5,331,116 A | 7/1994 | Haslam et al. |
| 5,342,501 A | 8/1994 | Okabayashi |
| 5,593,920 A | 1/1997 | Haslam et al. |
| 6,040,214 A | 3/2000 | Boyd et al. |
| 6,117,784 A | 9/2000 | Uzoh |
| 6,127,257 A | 10/2000 | Pintchovski et al. |
| 6,440,839 B1 | 8/2002 | Partovi et al. |
| 6,506,293 B1 | 1/2003 | Runpf |
| 7,001,833 B2 | 2/2006 | Bao et al. |
| 7,176,556 B2 * | 2/2007 | Okamoto et al. ............ 257/621 |
| 2001/0000917 A1 | 5/2001 | Arndt et al. |
| 2001/0040267 A1 | 11/2001 | Lien et al. |
| 2003/0080400 A1 | 5/2003 | Okamoto et al. |

(Continued)

FOREIGN PATENT DOCUMENTS

JP  56087326  7/1981

(Continued)

OTHER PUBLICATIONS

D.G. Chesebro, S.A. Mongeon, "Sub-Lithography Imaging Method," IBM Technical Disclosure Bulletin, vol. 31, No. 12, May 1989, pp. 142-143.

*Primary Examiner*—Thao P. Le
(74) *Attorney, Agent, or Firm*—Gibb I.P. Law Firm, LLC; Daniel Schnurmann, Esq.

(57) ABSTRACT

Conductive sidewall spacer structures are formed using a method that patterns structures (mandrels) and activates the sidewalls of the structures. Metal ions are attached to the sidewalls of the structures and these metal ions are reduced to form seed material. The structures are then trimmed and the seed material is plated to form wiring on the sidewalls of the structures.

15 Claims, 12 Drawing Sheets

U.S. PATENT DOCUMENTS

| | | |
|---|---|---|
| 2003/0102160 A1 | 6/2003 | Gaudiello et al. |
| 2003/0173671 A1 | 9/2003 | Hironaga et al. |
| 2003/0203636 A1 | 10/2003 | Anthony |
| 2004/0004288 A1 | 1/2004 | Sekiguchi |
| 2004/0028882 A1* | 2/2004 | Andricacos et al. ......... 428/209 |
| 2004/0178492 A1* | 9/2004 | Tsukamoto et al. ......... 257/690 |
| 2005/0084661 A1 | 4/2005 | Hosoi et al. |
| 2005/0108949 A1 | 5/2005 | Matsuda et al. |
| 2005/0167780 A1* | 8/2005 | Edelstein et al. ............ 257/531 |
| 2005/0184295 A1 | 8/2005 | Huang et al. |
| 2005/0250045 A1* | 11/2005 | Barr et al. ................ 430/270.1 |
| 2006/0105534 A1 | 5/2006 | Edelstein et al. |
| 2007/0021524 A1* | 1/2007 | Watanabe et al. ........... 522/170 |
| 2007/0131547 A1* | 6/2007 | Nomoto et al. ........ 204/403.01 |
| 2007/0175025 A1* | 8/2007 | Tsukamoto et al. ........... 29/832 |

FOREIGN PATENT DOCUMENTS

| | | |
|---|---|---|
| JP | 10261710 | 3/1997 |

* cited by examiner

WIRING PATERNS FORMED BY SELECTIVE METAL PLATING

CROSS-REFERENCE TO RELATED APPLICATIONS

This application is a division of U.S. application Ser. No. 10/905,590 filed Jan. 12, 2005 now U.S. Pat. No. 7,345,370.

BACKGROUND OF THE INVENTION

1. Field of the Invention

The invention generally relates to connective sidewall wiring formed in a method where metal ions are attached to sidewalls and are then reduced to form seed materials. The structures are then trimmed and the seed materials are plated to form wiring on the sidewalls.

2. Description of the Related Art

As integrated circuits are reduced in size, the wiring that connects active and passive devices must also be reduced in size. This makes the conventional wiring more expensive and more resistive. One methodology for forming smaller wiring involves forming conductive materials along the sidewalls of insulating mandrels. These structures are sometimes referred to as conductive sidewall spacers. If the mandrel is formed to the minimum attainable lithographic dimensions, the sidewall wiring that is formed along the structures is actually smaller than what can be patterned lithographically. For a detailed discussion of such sidewall spacers see U.S. Pat. Nos. 5,331,116; 5,593,920; and 6,127,257 which are incorporated herein by reference.

SUMMARY OF THE INVENTION

One embodiment herein comprises a method of forming conductive sidewall wiring. This method patterns structures (mandrels) and activates the sidewalls of the structures. Next, metal ions are attached to the sidewalls of the structures and these metal ions are reduced to form a seed material. The structures are then trimmed and the seed materials are plated to form wiring on the sidewalls of the structures.

The process of activating the sidewalls of the structures comprises applying a NH3 plasma, O2 plasma, etc. or TEOS or amine vapor/solution to the sidewalls of the structures. The process of attaching the metal ions comprises applying an aqueous solution of a metal compound, such as metal nitrate, etc. to the sidewalls of the structures. The process of reducing the metal ions comprises applying a H2 vapor or a hydrazine solution to the metal ions. A cap can also be formed on the structures prior to forming the seed materials. In addition, the trimming process trims loops of the seed material that are formed around sidewalls of the mandrels.

This produces a wiring structure that has seed material on the sidewalls of the structure, and plated metal wiring on the seed material and sidewalls of the structure. This plated metal wiring therefore comprises multiple metal layers that are non-symmetric along the vertical sidewall surfaces. The sidewalls have one of amino and carboxylic acid functionalities after they are activated by the NH3 plasma, O2 plasma, or TEOS or amine vapor/solution. The mandrel structure can comprise an organic polymer, such as a photoresist, etc.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF EMBODIMENTS OF THE INVENTION

As mentioned above, conductive sidewall spacers can be utilized as extremely dense wiring and conductive plates for capacitive structures. However, conventional methodologies for manufacturing conductive sidewall spacers have difficulty forming such structures with high-aspect ratios. Further, it is sometimes difficult to control where the sidewall spacers are actually formed, which can result in open or short circuits. Therefore, the following methodology has been developed to produce a structure that has a very high aspect ratio and that easily defines where the conductive sidewalls will be formed.

Figure 1:
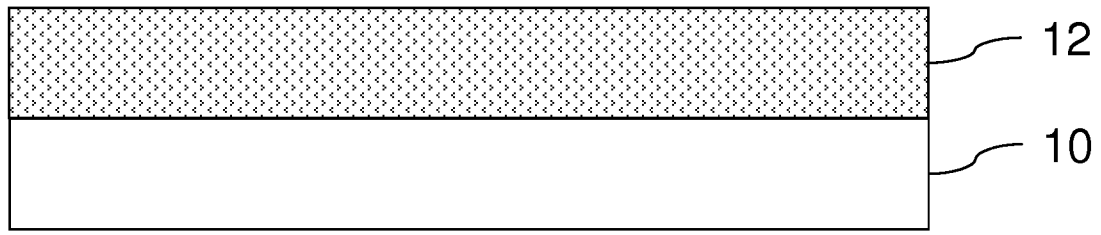
FIG. 1 is a schematic cross-sectional diagram of a partially completed wiring structure.

More specifically, as shown in cross-sectional representation in FIG. 1, this method begins by forming a mandrel material 12, such as any common insulator including oxides, glasses, polymers, organic materials, etc. on any form of substrate 10, such as a silicon or non-silicon wafer, etc. Next, as shown in cross-section view in FIG. 2, the invention patterns an optional cap 22, such as a silicon nitride or similar material over the mandrel material 12. More specifically, the cap material 22 can be deposited across the entire mandrel material 12, and then a separate photoresist mask 24 can be patterned over the cap material 22. The photoresist mask can then be exposed, developed, etc., as is well-known in the art. Then, the cap material 22 can be patterned by reactive ion etching (RIE) using the photoresist mask 24. Then, directional RIE can be utilized to pattern the mandrel material 12 into insulating mandrels 20.

Figure 2:
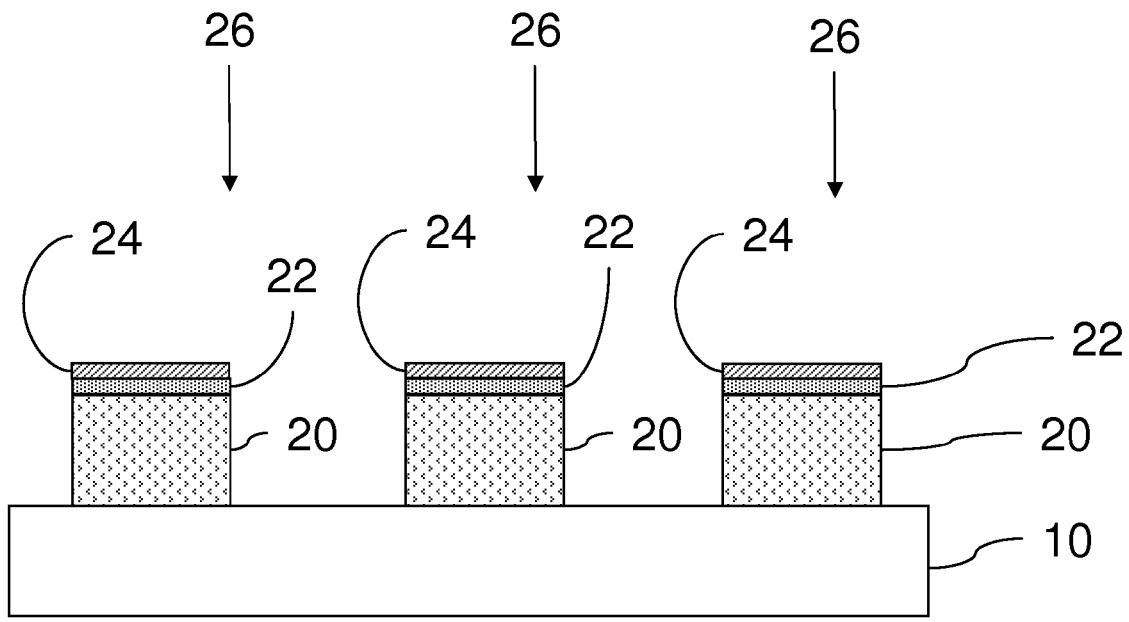
FIG. 2 is a schematic cross-sectional diagram of a partially completed wiring structure.

Next, the invention activates the sidewalls of the structures by applying a NH3 plasma, O2 plasma, or TEOS (Tetraethyl Orthosilicate, Si (OC2H5)4), or amine vapor/solution to the sidewalls of the structures, as shown by arrows 26 in FIG. 2. The process of activating the sidewalls conditions the mandrel material 20 so as to provide them with organic amino, carboxylic acid, hydroxyl, etc., functionalities. Therefore, in addition to the activating plasmas, vapors, or solutions mentioned above, any treatment that will provide organic amino, carboxylic acid, etc. functionalities to the sidewalls will be useful with the invention.

For example, deposition of maleic anhydride polymer by plasma CVD methods can be followed by activation with a dendritic amine. The activation with the amine can be performed after the trim step if desired, in order to avoid interactions between the resist chemistry of the trim mask and the amine material. The plasma polymerized maleic anhydride is non-selective, and will deposit on all surfaces of the substrate. It can be etched with an oxygen RIE to remove the materials from the horizontal surfaces, leaving a thin spacer of polymer material on the sidewalls of the mandrel. The amine dendrimer can be applied as a methanol solution, (polyamidoamine, 10% w/v in methanol), followed by a methanol rinse. Alternatively, a soluble maleic anhydride polymer or copolymer can be spin applied and soft-baked, and used directly as the mandrel material, being activated with amine solution after etch and develop. Alternatively, a resist formulation containing a reactive component such as maleic anhydride polymer or copolymer can be image-wise exposed and developed, followed by activation with amine. The amine material can be removed from the horizontal surfaces of the resist image by means of oxygen or argon RIE, leaving the sidewalls of the resist functionalized with amine.

In another method, ammonia plasma can be used to aminate mandrel surfaces. An Ar or oxygen RIE can be used to clean horizontal surfaces prior to metal deposition. Hydrogen Silsesquioxane materials can be used to form the mandrel, and can be left in place in the semiconductor device as part of the dielectric material, if desired. An organic Mandrel could also be used in this method.

In another method, plasma polymerized acetaldehyde, acetic acid, or diamino-ethane, or similar materials, can be deposited on the mandrel surface. Ar or oxygen RIE can be used to remove these materials from horizontal surfaces, leaving a thin spacer of polymer material on the sidewalls of the mandrel. The aldehyde, carboxylic acid or amine functionalities remaining on the mandrel sidewall can be used to bind metal ion seed layer materials to the sides of the mandrel.

In another method, the mandrel itself can be composed of a material containing active amine or carboxylate species as part of the material, either as an additive to a polymer matrix or as a component of the polymer itself.

Figure 3:
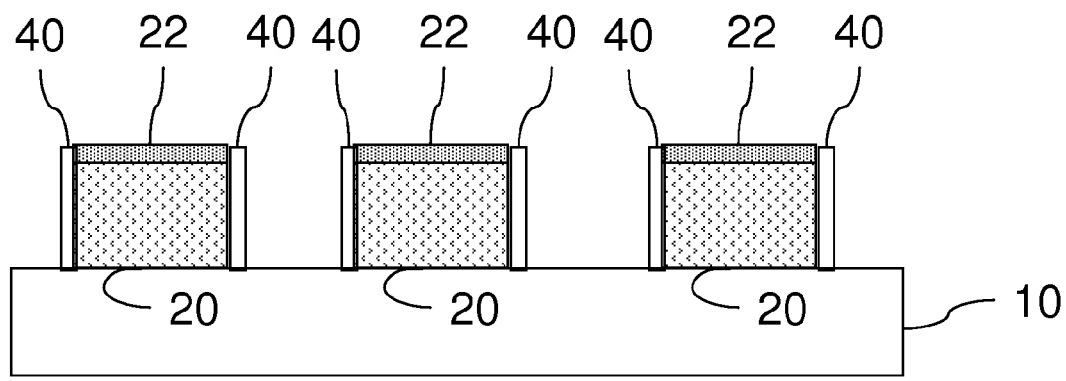
FIG. 3 is a schematic cross-sectional diagram of a partially completed wiring structure.

The photoresist 24 can be removed at any point after the cap material 22 is patterned, as shown in cross-section in FIG. 3. Next, as also shown in FIG. 3, metal ions, such as palladium, platinum, Ni, Rh, Ru, Co, Ag, Cu, Pt ions (can be used to reduce copper II ions to copper metal, etc.), are attached to the sidewalls of the structures 20, and these metal ions are reduced to form metallic seed materials 40. The process of attaching the metal ions comprises applying an aqueous solution of metal compounds, such as metal nitrate, chlorides, bromides, fluorides, sulfates, sulfonates, phosphates, tetrafluoroborates, hexafluorosulfates, acetylacetonates, or similar materials, etc., to the sidewalls of the structures. Organometallic reagents might also be used, either as a vapor or in solution, such as (methylcyclopentadienyl) trimethylPlatinum, or carbonyls such as nickel carbonyl ((Ni(CO)4), which is a gas at ambient conditions.

Figure 4:
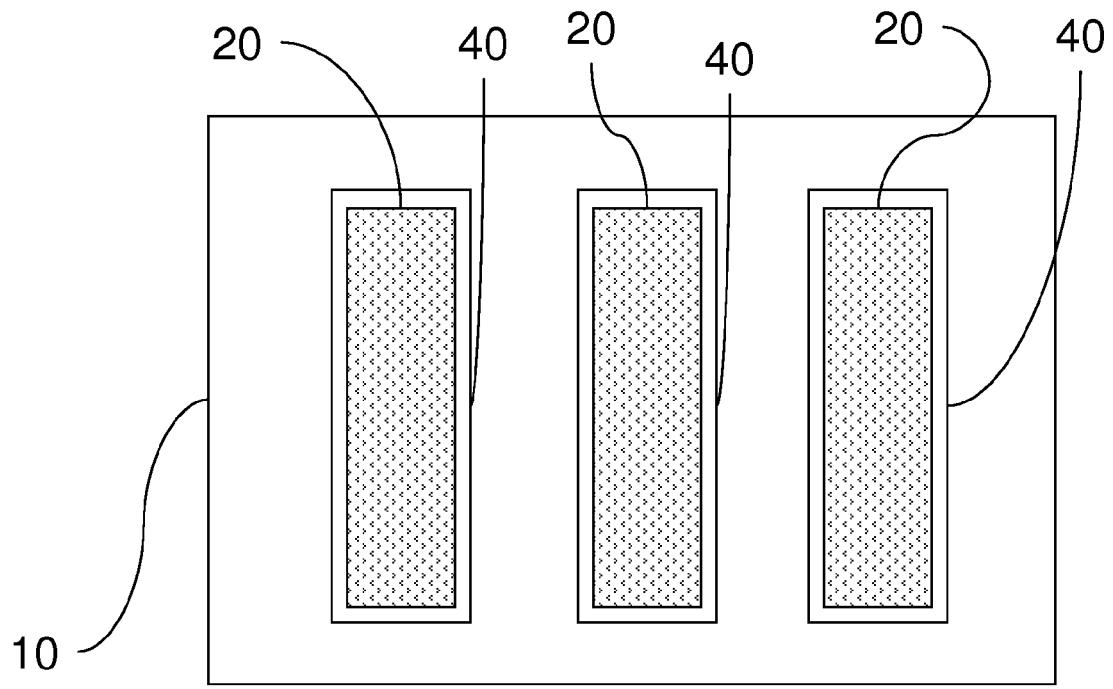
FIG. 4 is a schematic top-view diagram of a partially completed wiring structure.

The process of reducing the metal ions comprises applying a hydrogen or hydrogen diluted with Argon or other inert gas, e.g., He, Ne, N2, at temperatures from ambient to 400 C, depending on the metal to be reduced. Hydrazine or alkyl hydrazines could also be used as a reducing agent in solution to the metal ions. FIG. 4 illustrates the same structure shown in FIG. 3 from a top-view.

Figure 5:
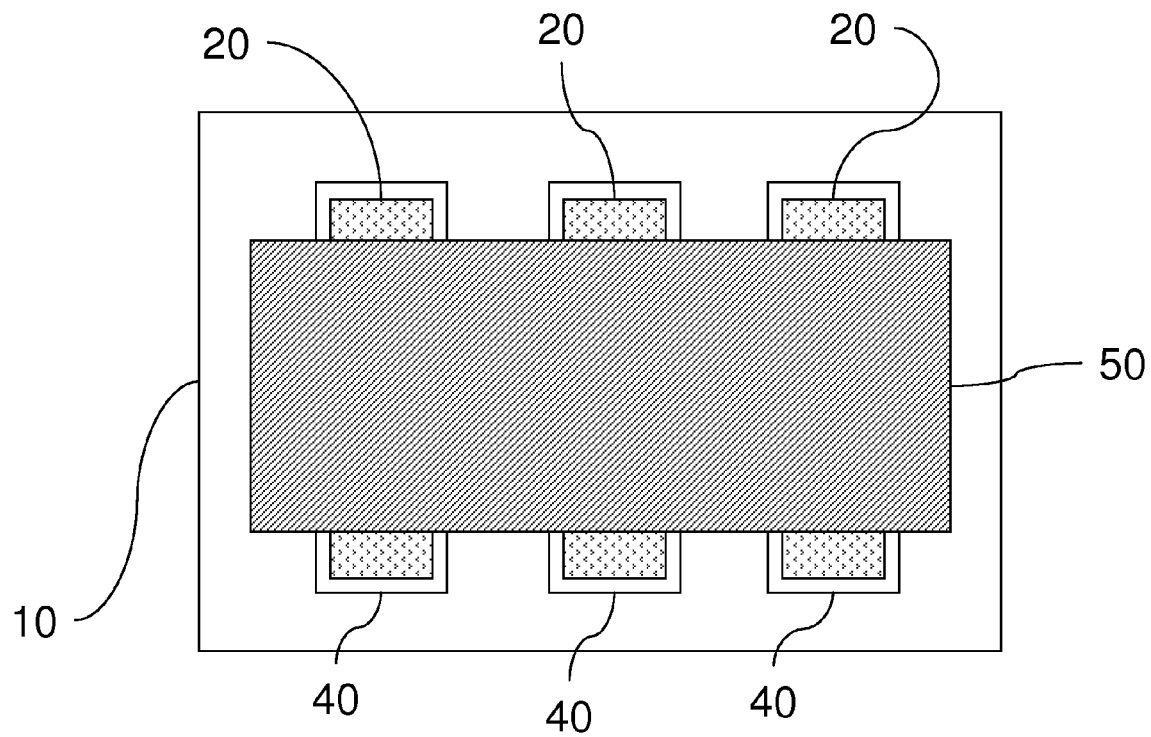
FIG. 5 is a schematic top-view diagram of a partially completed wiring structure.
Figure 6A:
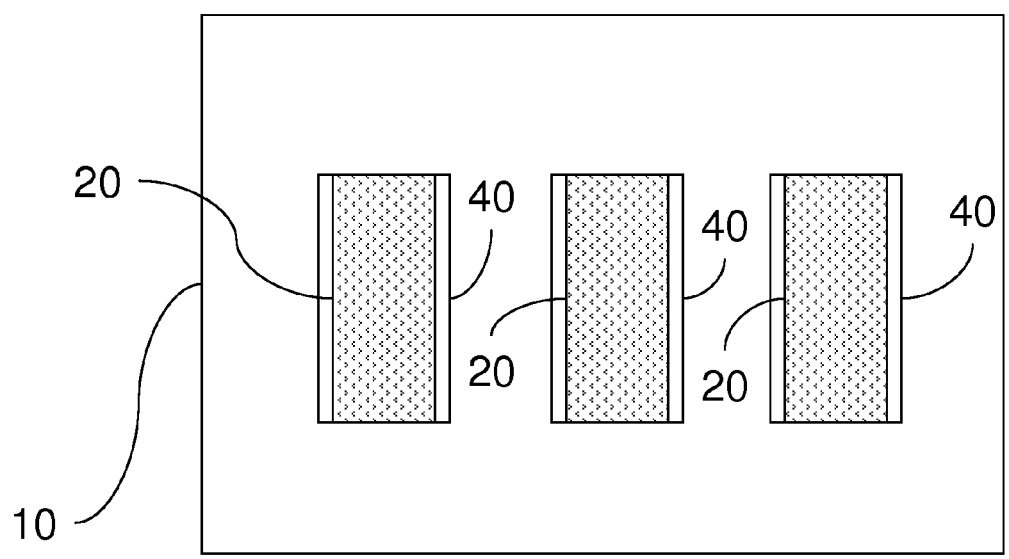
FIGS. 6A and 6B are schematic top-view diagrams of a partially completed wiring structure.
Figure 6B:
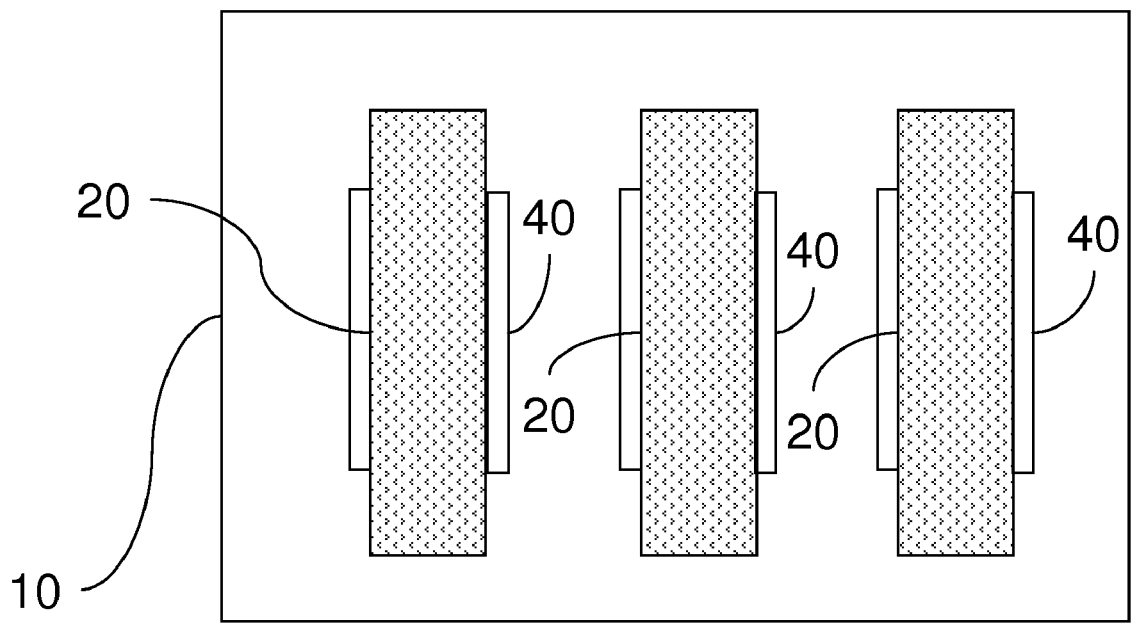

The mandrels 20 are then trimmed as shown in top-view in FIGS. 5-6B. More specifically, a mask 50 (such as a photoresist or hard mask) is formed, as shown in FIG. 5. Then, using the mask 50, the end of the mandrels 20 (and the seed material 40) can be trimmed using any well-known material removal process, such as wet or dry etching, chemical rinsing, etc. as shown in FIG. 6A. Alternatively, as shown in FIG. 6B, the mandrels 20 can be allowed to remain in place while the non-protected areas of the seed material 40 are removed through a selective etching or chemical rinsing process. This process selectively trims the loops of the seed material 40 that were formed around the sidewalls of the mandrels 20 into individual length of seed material that will be used in a subsequent plating process to form individual linear conductive sidewall plated structures.

Figure 7:
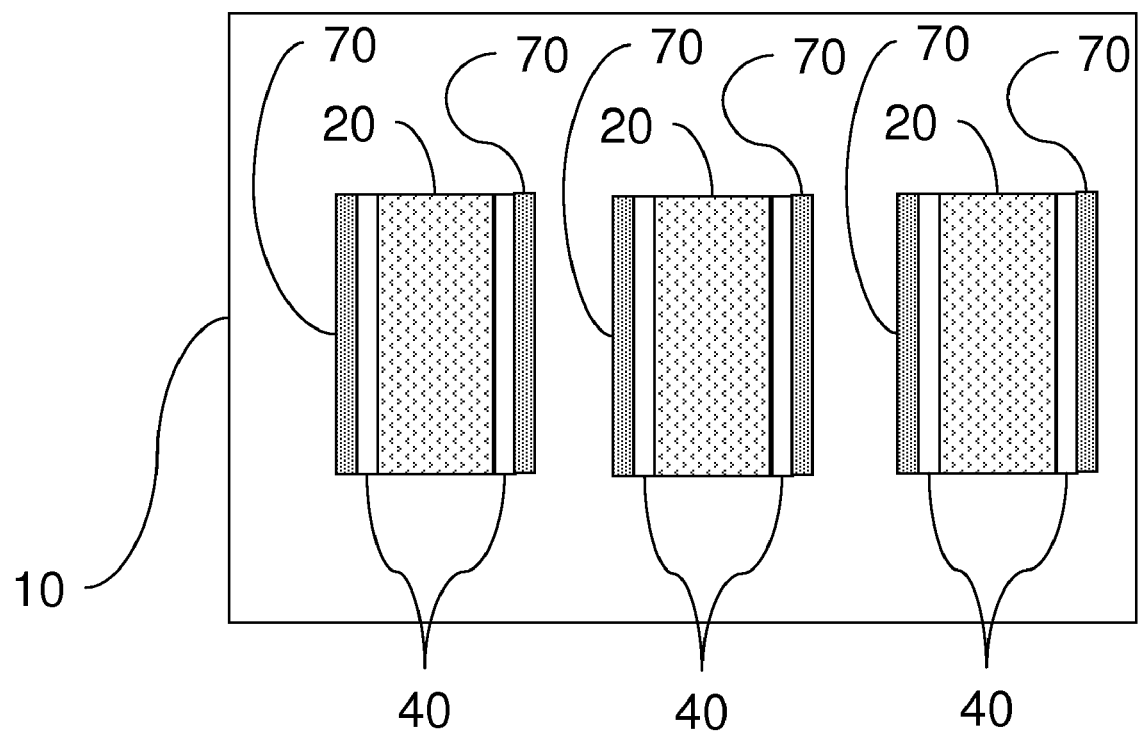
FIG. 7 is a schematic top-view diagram of a partially completed wiring structure.
Figure 8:
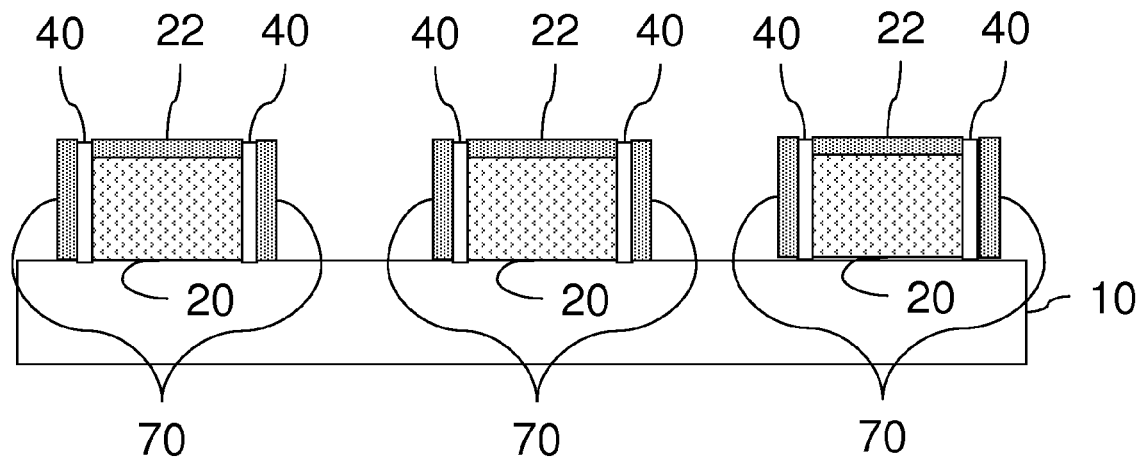
FIG. 8 is a schematic cross-sectional diagram of a partially completed wiring structure.

More specifically, as shown in top-view in FIG. 7 and cross-sectional view in FIG. 8, the seed materials are plated with a conductive material 70 (such as copper, palladium, platinum, etc.) to form wiring on the sidewalls of the structures. This plating process can comprise any well-known electrical or non-electrical based plating process and can be used with any type of metal that easily plate to the seed material 40. As would be understood by one ordinarily skilled in the art given this disclosure, the seed material 40 is selected to be compatible with the material 70 which is plated onto the seed material 40 and any types of conductive materials that will easily plate together can be used with the invention. Therefore, the invention is not limited to the materials that are discussed above, but instead the foregoing materials are merely used as examples. The wiring comprises the remnants of the seed material 40 and the plated material 70, both of which are conductive (plated conductor).

Figure 9:
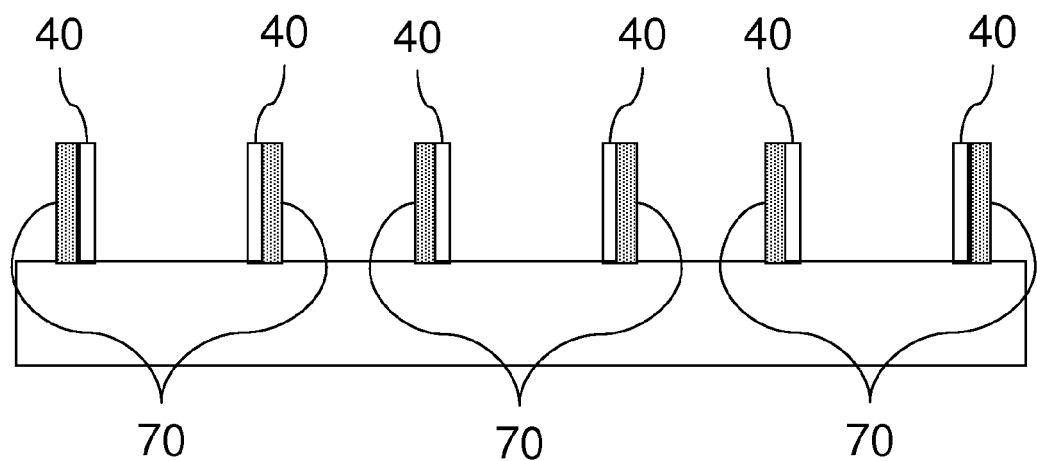
FIG. 9 is a schematic cross-sectional diagram of a partially completed wiring structure according to one embodiment.
Figure 10:
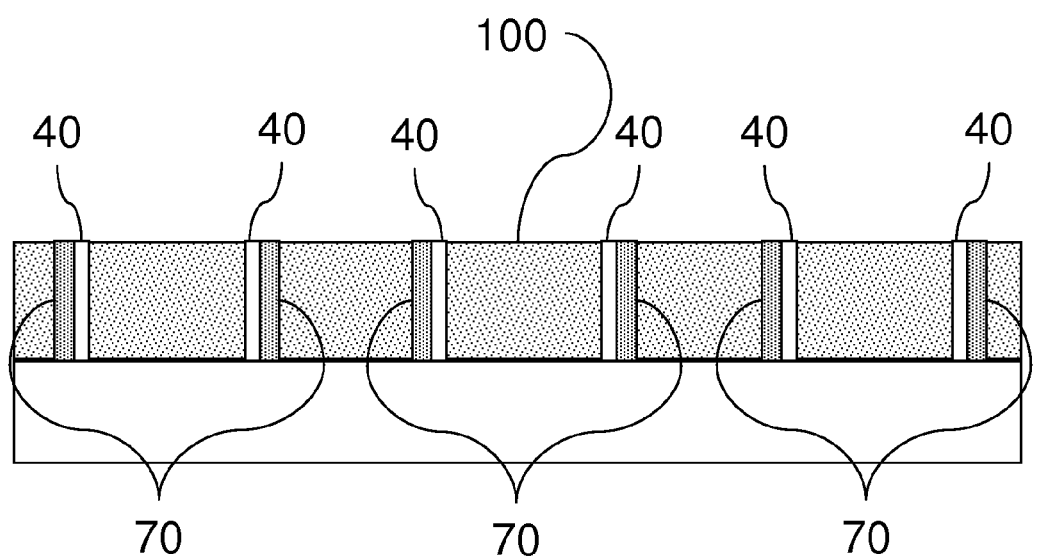
FIG. 10 is a schematic cross-sectional diagram of a partially completed wiring structure according to one embodiment.

Then, as shown in FIG. 9, a selective material removal process such as etching, chemical rinsing, etc. is utilized to remove the cap 22 and the mandrel 20, leaving the plated wiring 70 and the seed material 40 remaining freestanding. Then, as shown in FIG. 10, the entire structure is covered by an insulator 100, such as silicon dioxide, fluorinated silicon dioxide, or other known low-K dielectric films, as well as TaN, TiN, Ta, WN, which can be planarized as shown in FIG. 10. This produces a final wiring structure that has a seed material 40 and plated wiring 70 on the seed material 40 separated by insulator 100. This plated wiring therefore comprises multiple metal layers (40, 70) that are non-symmetric vertically.

Figure 11:
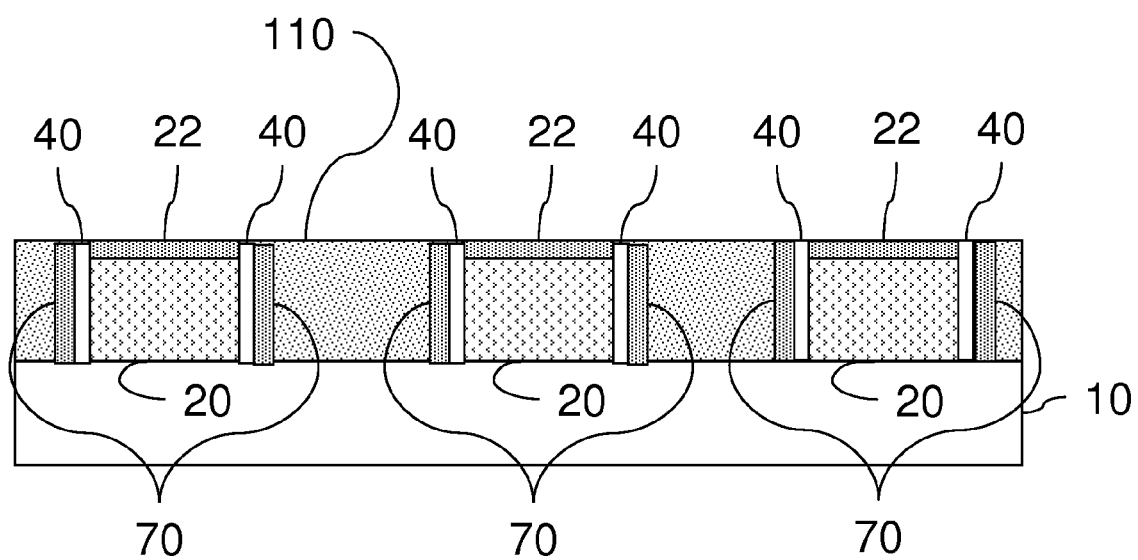
FIG. 11 is a schematic cross-sectional diagram of a partially completed wiring structure according to another embodiment.
Figure 12:
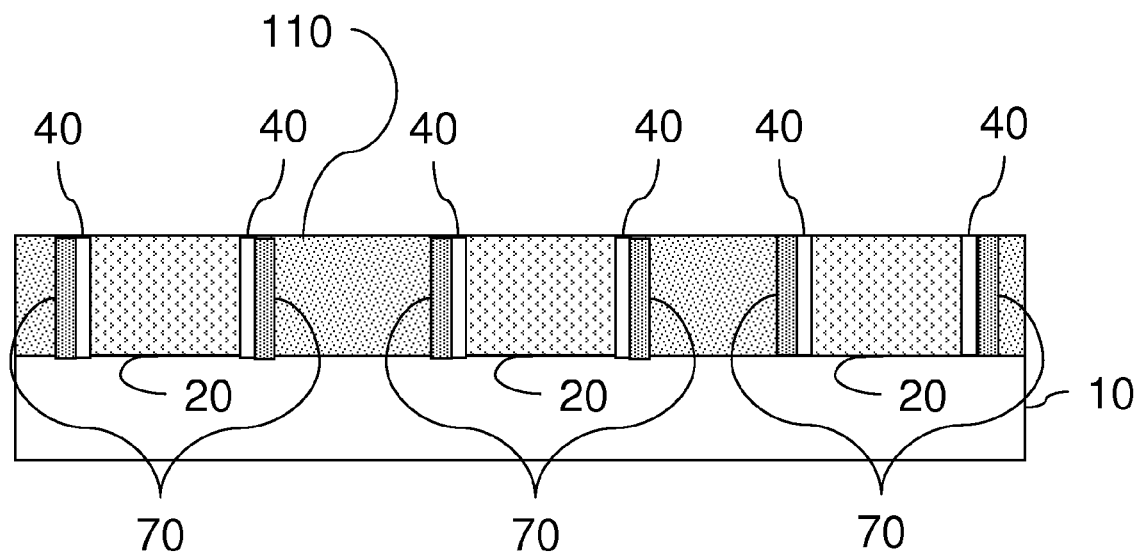
FIG. 12 is a schematic cross-sectional diagram of a partially completed wiring structure according to another embodiment.
Figure 13:
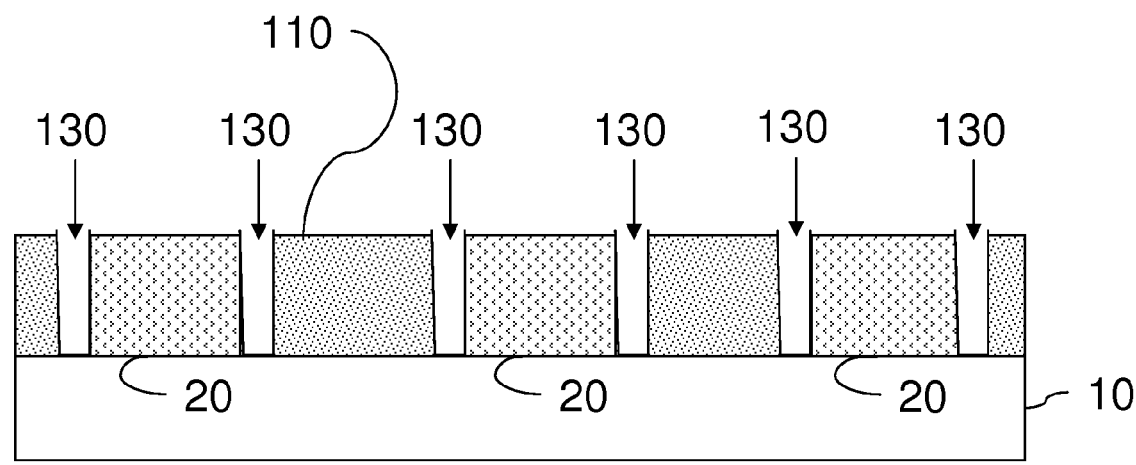
FIG. 13 is a schematic cross-sectional diagram of a partially completed wiring structure according to another embodiment.
Figure 14:
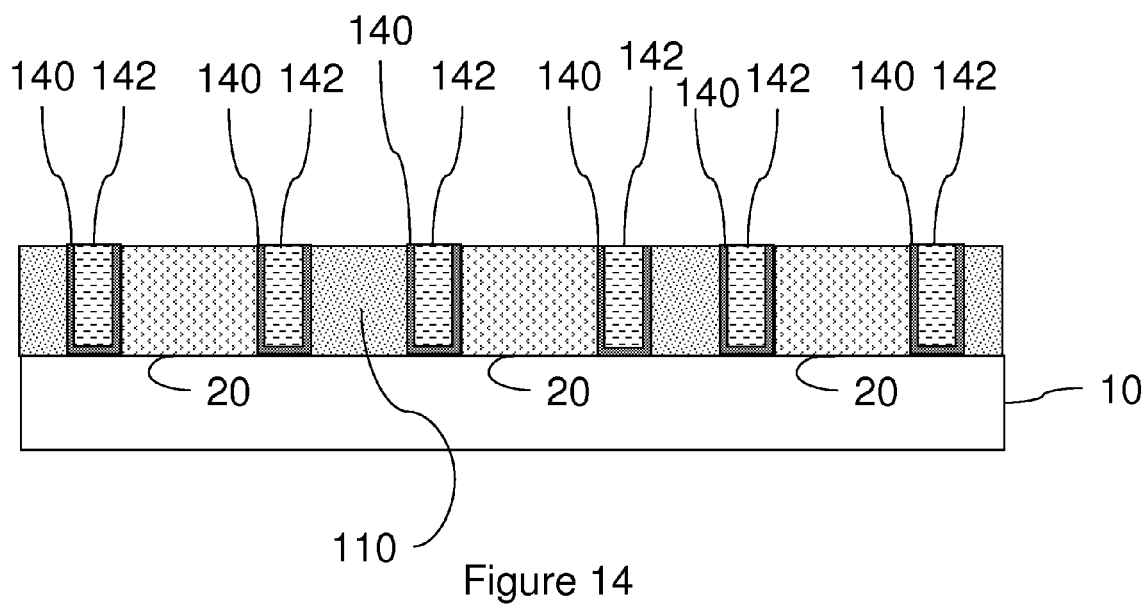
FIG. 14 is a schematic cross-sectional diagram of a partially completed wiring structure according to another embodiment.
Figure 15:
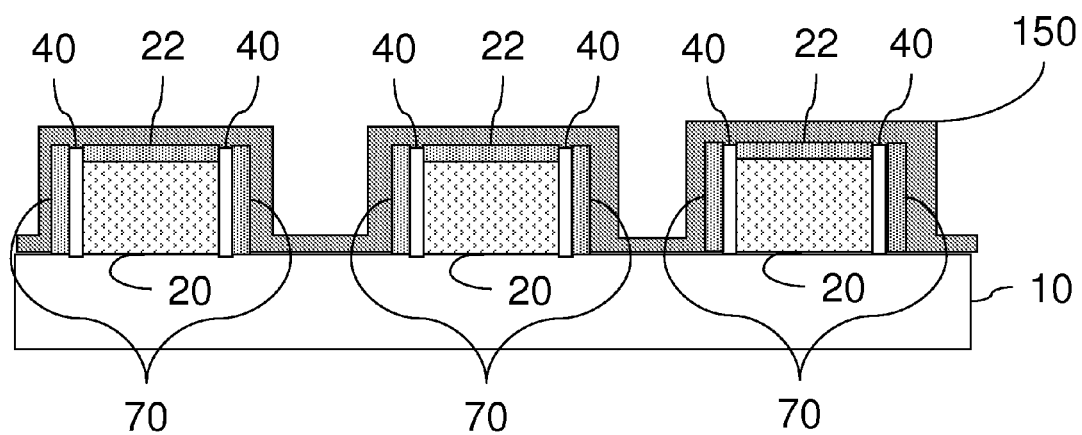
FIG. 15 is a schematic cross-sectional diagram of a partially completed wiring structure according to yet another embodiment.

Another embodiment is shown in FIGS. 11-14 which begins with the structure shown in FIG. 8, but use different processing steps thereafter. More specifically, as shown in FIG. 11, an insulator 110, such as any of the insulators discussed above, is deposited over the structure. The structure is planarized as shown in FIG. 12 which removes the cap 22. Next, as shown in FIG. 13, the seed material 40 and the plated wiring 70 are removed using any well-known selective removal process to leave openings 130 between the insulating materials 20, 110. Next, as shown in FIG. 14, the openings 130 are lined with a dielectric liner 140 and then filled with any form of conductor 142 and a damascene process.

Figure 16:
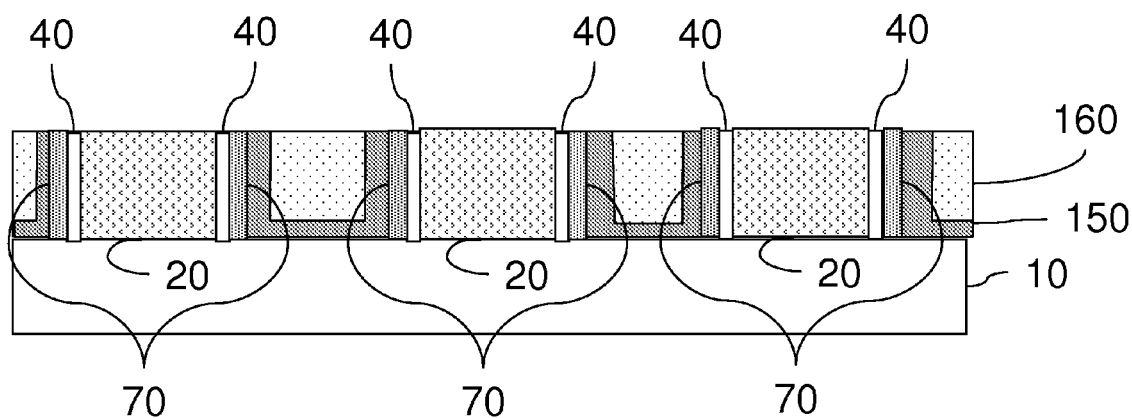
FIG. 16 is a schematic cross-sectional diagram of a partially completed wiring structure according to yet another embodiment.
Figure 17:
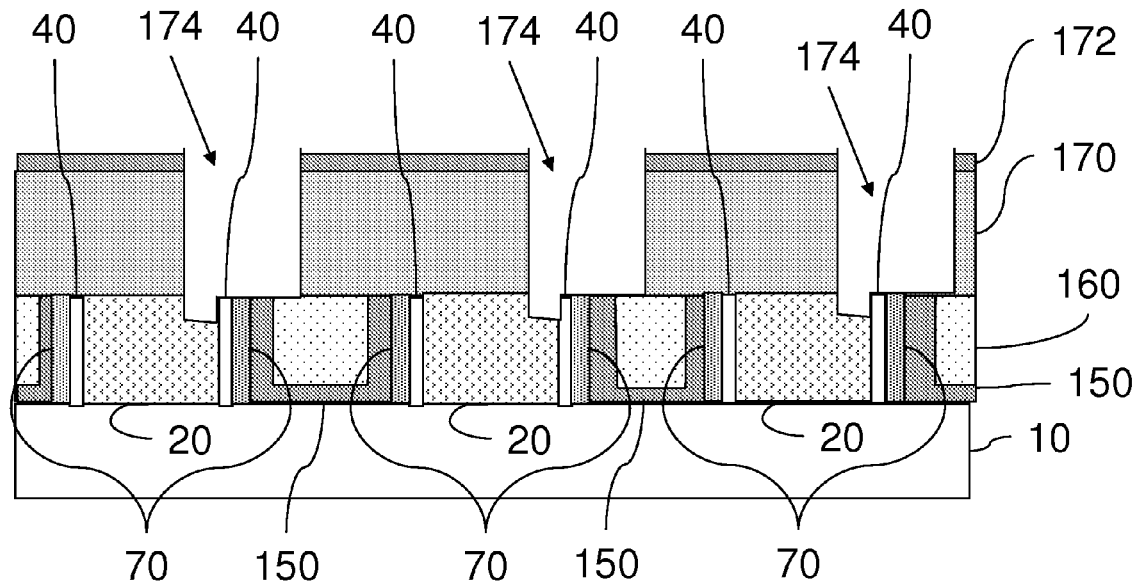
FIG. 17 is a schematic cross-sectional diagram of a partially completed wiring structure according to yet another embodiment.

Yet another embodiment is shown in FIGS. 15-21. This embodiment also begins with the structure shown in FIG. 8 and coats the structure with an additional cap material 150 which can be, for example, silicon dioxide deposited using a plasma process. Next, as shown in FIG. 16, a dielectric 160 such as a black diamond dielectric is deposited over the structure and the structure is planarized to remove the cap 22. Then, as shown in FIG. 17, another dielectric 170 (similar to the dielectrics discussed above) is deposited over the structure and another layer of cap material 172 is patterned over the structure in a similar manner as the discussed above. Then, a material removal process is utilized to form openings 174 through the insulator 170 and a portion of the mandrel 20.

Figure 18:
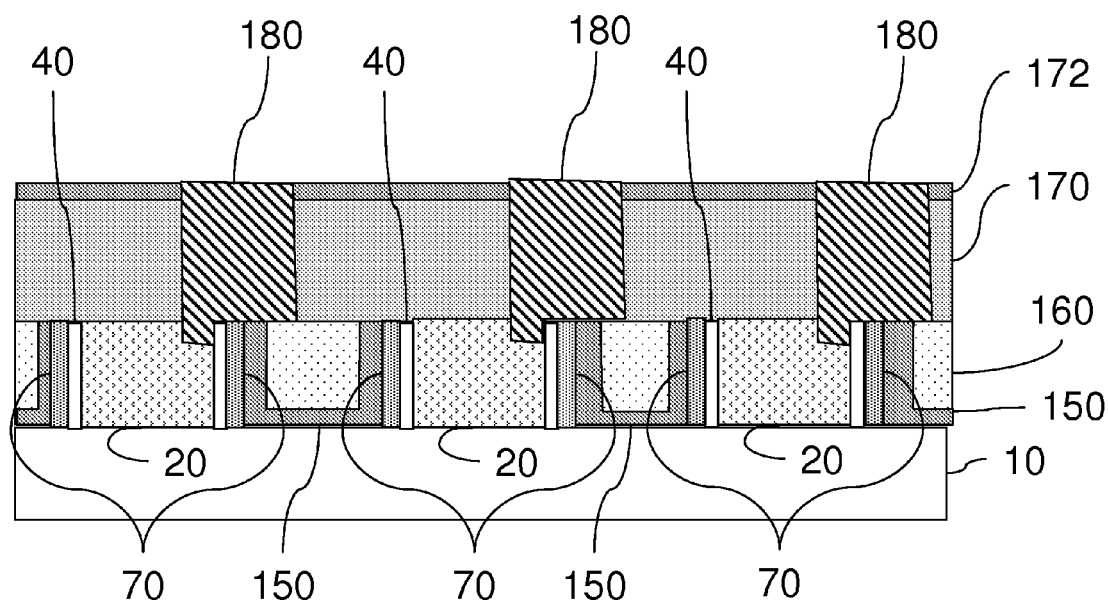
FIG. 18 is a schematic cross-sectional diagram of a partially completed wiring structure according to yet another embodiment.
Figure 19:
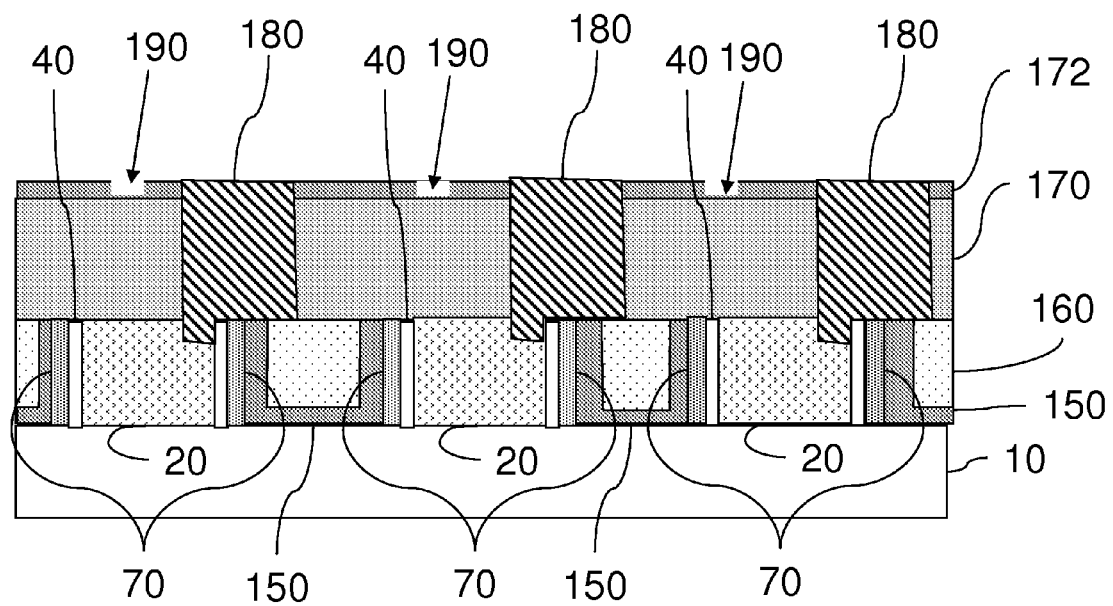
FIG. 19 is a schematic cross-sectional diagram of a partially completed wiring structure according to yet another embodiment.
Figure 20:
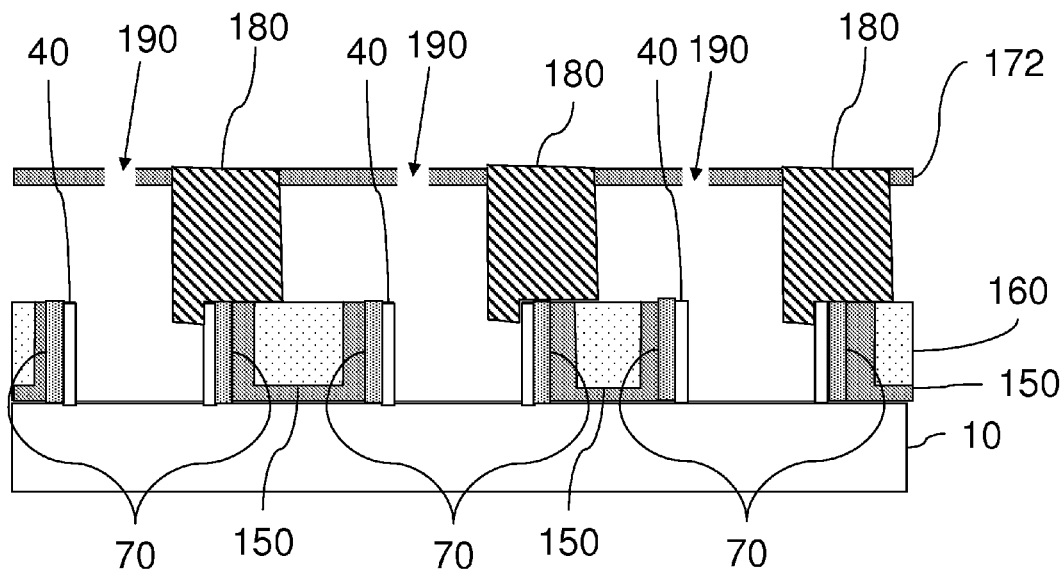
FIG. 20 is a schematic cross-sectional diagram of a partially completed wiring structure according to yet another embodiment.

Next, as shown in FIG. 18, the openings 174 are filled with any form of conductor 180 and the structure is planarized. Next, as shown in FIG. 19, openings 190 are patterned in the cap layer 172 using similar processing to that discussed above. As shown in FIG. 20, a material removal process is performed through the openings 190 to remove the insulator 170 and the mandrels 20. This leaves air as an insulator between the conductors formed by the seed material 40 and the plated material 70.

Figure 21:
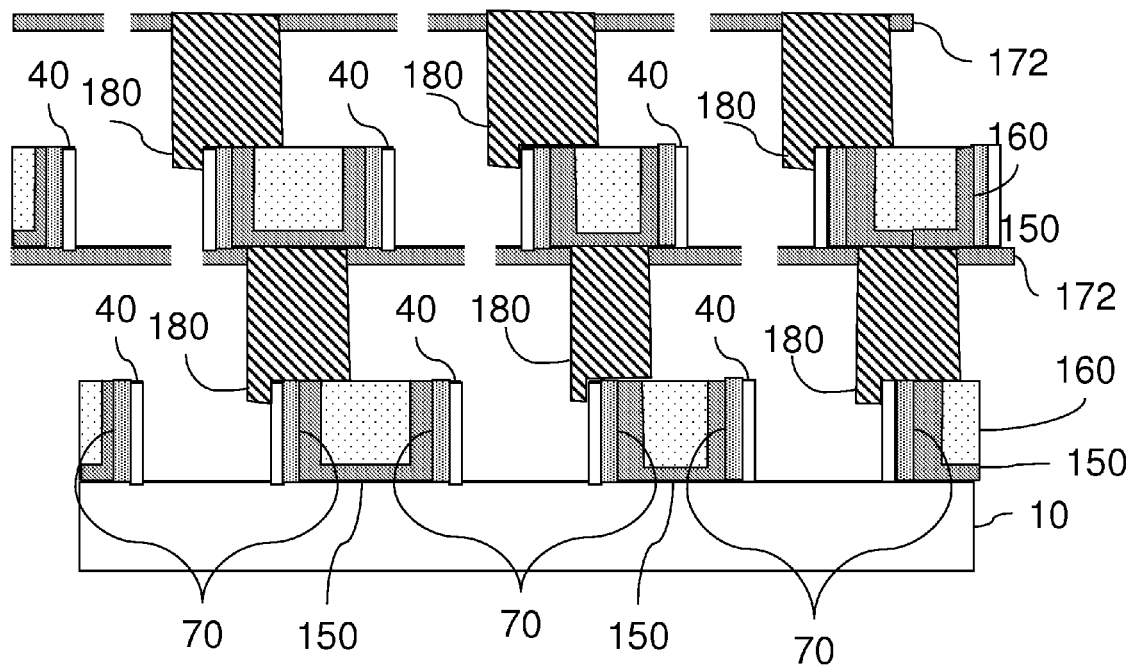
FIG. 21 is a schematic cross-sectional diagram of a partially completed wiring structure according to and additional embodiment.
Figure 22:
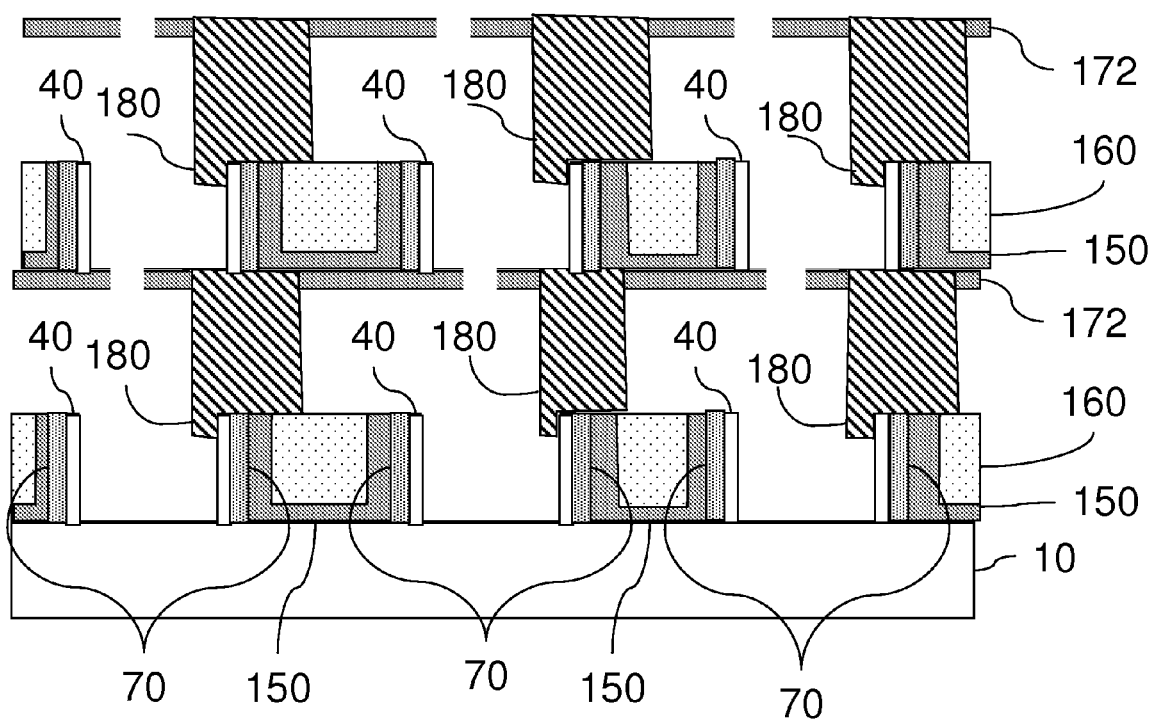
FIG. 22 is a schematic cross-sectional diagram of a partially completed wiring structure according to an additional embodiment.

As shown in FIG. 21, another embodiment can stack the structure shown in FIG. 20 by repeating the processing shown above. Note that in this embodiment, each conductor 180 is insulated by the cap material 150 and insulator 160 from the conductive seed material and plated material 40, 70 of the overlying layer. This is accomplished by aligning the layers differently. Another embodiment can align the layers similarly to allow the conductors 180 and each layer to be electrically connected by the conductive seed material and plated material 40, 70, as shown in FIG. 22.

The present invention and the various features and advantageous details thereof are explained more fully with reference to the nonlimiting embodiments that are illustrated in the accompanying drawings and detailed in the description, above. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The invention allows wiring patterns to be formed which are very narrow and of very high aspect ratio, and with small image width tolerance values across the chip, wafer, or batch of wafers. The pattern is formed by selective deposition, using a process that is surface limited and therefore highly conformal. The width of such patterns are determined by the deposition time and deposition conditions, rather than by mask uniformity, optics uniformity, focus control of a stepper, exposure dose uniformity, or etch uniformity across a wafer or across a chip. The high aspect ratio of the wiring features aids in reducing capacitance, as a thicker dielectric layer may be used to separate adjacent wiring mask levels. Reduced capacitance enhances chip speed, or performance.

While the invention has been described in terms of embodiments, those skilled in the art will recognize that the invention can be practiced with modification within the spirit and scope of the appended claims.

What is claimed is:

1. A wiring structure comprising:
   a substrate having a top surface;
   a mandrel structure on said top surface of said substrate, wherein said mandrel structure comprises a discrete rectangular-shaped insulator body, and
   wherein said mandrel structure has conditioned sidewalls having one of amino, carboxylic acid, and hydroxyl functionalities;
   a seed material bonded to said conditioned sidewalls of said mandrel structure, said seed material in contact with and extending vertically from said top surface of said substrate; and
   plated wiring on said seed material, said plated wiring in contact with and extending vertically from said top surface of said substrate.

2. The wiring structure according to claim 1, further comprising:
   a first cap layer positioned laterally adjacent to said plated wiring such that said plated wiring is between said first cap layer and said seed material;
   a first dielectric layer positioned laterally adjacent to said first cap layer such that said first cap layer is between said plated wiring and said first dielectric layer;
   a second dielectric layer above said mandrel structure, said seed material, said plated wiring, said first cap layer and said first dielectric layer; and
   a conductor-filled opening that extends through said second dielectric layer and into a top corner portion of said mandrel structure adjacent to said seed material, wherein said conductor-filled opening comprises a conductor adjacent to said seed material, said plated wiring, said first cap layer and said first dielectric layer.

3. The wiring structure according to claim 1, wherein said seed material and said plated wiring form a non-symmetric vertical structure on said conditioned sidewalls of said mandrel structure.

4. The wiring structure according to claim 1, wherein said seed material comprises reduced metal ions attached to said conditioned sidewalls and wherein said metal ions comprise at least one of palladium, platinum, nickel, rhodium, ruthenium, cobalt and silver.

5. The wiring structure according to claim 1, wherein said plated wiring comprises trimmed wires.

6. The wiring structure according to claim 1, wherein said mandrel structure comprises an organic polymer.

7. The structure according to claim 1, wherein said mandrel structure comprises one of $SiO_2$, $FSiO_2$, TaN, TiN, Ta, WN.

8. A wiring structure comprising:
a substrate having a top surface;
a plurality of mandrel structures on said top surface of said substrate,
   wherein each of said mandrel structures comprises a discrete rectangular-shaped insulator body, and
   wherein each of said mandrel structures has the following:
      conditioned sidewalls;
      a seed material bonded to said conditioned sidewalls, said seed material in contact with and extending vertically from said top surface of said substrate; and
      plated wiring on said seed material, said plated wiring in contact with and extending vertically from said top surface of said substrate;
a first cap layer lining spaces between said plating wiring of adjacent mandrel structures;
a first dielectric layer on said first cap layer;
a second dielectric layer above said mandrel structures, said seed material, said plated wiring, said first cap layer and said first dielectric layer; and
conductor-filled openings that extends through said second dielectric layer and into a top corner portion of each of said mandrel structures adjacent to said seed material, wherein said conductor-filled openings comprise a conductor adjacent to said seed material, said plated wiring, said first cap layer and said first dielectric layer.

9. The wiring structure according to claim 8, wherein said conditioned sidewalls having amino functionalities.

10. The wiring structure according to claim 8, wherein said conditioned sidewalls having carboxylic acid functionalities.

11. The wiring structure according to claim 8, wherein said conditioned sidewalls having hydroxyl functionalities.

12. The wiring structure according to claim 8, wherein said seed material comprises reduced metal ions attached to said conditioned sidewalls and wherein said metal ions comprise at least one of palladium, platinum, nickel, rhodium, ruthenium, cobalt and silver.

13. The wiring structure according to claim 8, wherein said plated wiring comprises trimmed wires.

14. The wiring structure according to claim 8, wherein said mandrel structures comprise an organic polymer.

15. The wiring structure according to claim 8, wherein said mandrel structures comprise one of $SiO_2$, $FSiO_2$, TaN, TiN, Ta, WN.

* * * * *